US010043569B2

(12) United States Patent
Park et al.

(10) Patent No.: US 10,043,569 B2
(45) Date of Patent: Aug. 7, 2018

(54) MEMORY DEVICE FOR DETECTING FAILURE OF MEMORY CELLS AND REFRESHING MEMORY CELLS

(71) Applicant: SK hynix Inc., Gyeonggi-do (KR)

(72) Inventors: Min-Su Park, Gyeonggi-do (KR); Jae-Il Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 120 days.

(21) Appl. No.: 15/066,841

(22) Filed: Mar. 10, 2016

(65) Prior Publication Data

US 2017/0068584 A1    Mar. 9, 2017

(30) Foreign Application Priority Data

Sep. 9, 2015  (KR) .................. 10-2015-0127476

(51) Int. Cl.
*G06F 11/07*    (2006.01)
*G11C 11/406*   (2006.01)
*G11C 11/4091*  (2006.01)
*G11C 29/00*    (2006.01)

(52) U.S. Cl.
CPC ........ *G11C 11/406* (2013.01); *G11C 11/4091* (2013.01); *G11C 11/40611* (2013.01); *G11C 29/00* (2013.01)

(58) Field of Classification Search
CPC ............. G06F 11/1004; G06F 11/1068; G06F 11/1048; G06F 11/106; G06F 11/1076; G06F 11/0751; G06F 11/079; G06F 11/1012; G06F 11/1441; G06F 2201/85; G06F 2201/88; G11C 13/0033; G11C 13/0002
See application file for complete search history.

(56) References Cited

U.S. PATENT DOCUMENTS 7,251,180 B2 *  7/2007  Ishikawa ............... G11C 11/406 365/189.02
7,688,655 B2 *  3/2010  Takai .................... G11C 11/406 365/200
7,836,374 B2 * 11/2010  Klein ....................... G11C 7/20 714/754
8,060,691 B2 * 11/2011  Pyeon .................. G06F 13/4247 710/52
9,036,439 B2 *  5/2015  Kim .................... G11C 11/40622 365/189.07

(Continued)

FOREIGN PATENT DOCUMENTS

KR   1020130117198   10/2013
KR   1020170023249   3/2017

*Primary Examiner* — Nadeem Iqbal
(74) *Attorney, Agent, or Firm* — IP & T Group LLP

(57) ABSTRACT

A memory device may include a plurality of memory cells; a refresh counter suitable for generating a refresh address; an address storage circuit suitable for storing an additional refresh address; an error detection unit suitable for detecting an error of selected memory cells of the plurality of memory cells in response to a refresh command in a detection period; and a refresh control unit suitable for refreshing memory cells corresponding to the refresh address or the additional refresh address among the memory cells in response to the refresh command, and controlling the refreshing of the memory cells to be delayed in the detection period.

20 Claims, 6 Drawing Sheets

(56) References Cited

U.S. PATENT DOCUMENTS

| | | | |
|---|---|---|---|
| 2003/0169634 A1* | 9/2003 | Kilmer | G11C 11/406 365/222 |
| 2007/0206430 A1* | 9/2007 | Takai | G11C 11/406 365/201 |
| 2008/0209110 A1* | 8/2008 | Pyeon | G06F 13/4243 711/103 |

* cited by examiner

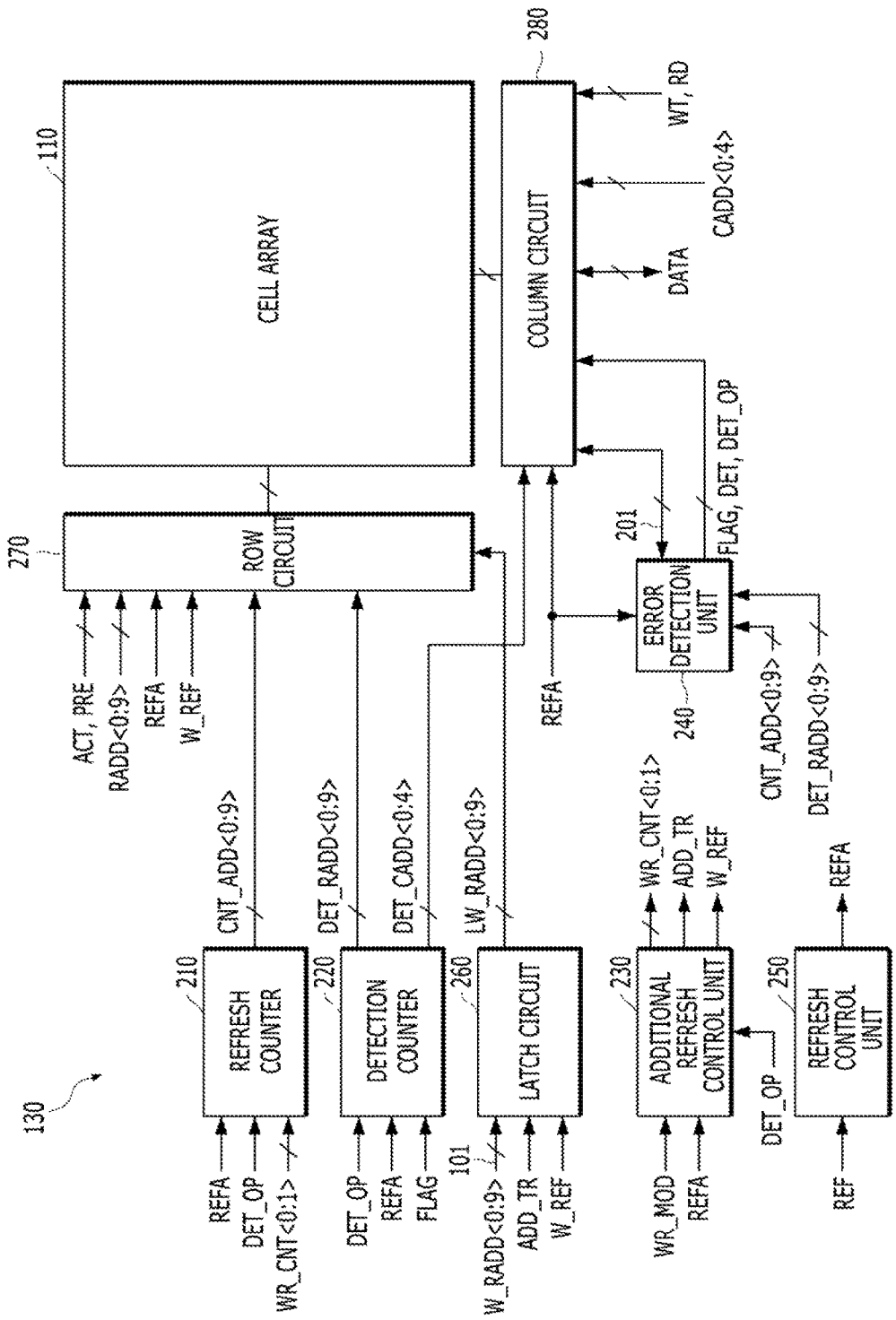

MEMORY DEVICE FOR DETECTING FAILURE OF MEMORY CELLS AND REFRESHING MEMORY CELLS

CROSS-REFERENCE TO RELATED APPLICATIONS

The present application claims priority of Korean Patent Application No. 10-2015-0127476, filed on Sep. 9, 2015, which is incorporated herein by reference in its entirety.

BACKGROUND

1. Field

Exemplary embodiments of the present invention relate generally to a memory device.

2. Description of the Related Art

Memory devices may include a plurality of memory cells, each of which includes a cell transistor serving as a switch and a cell capacitor for storing an electrical charge representing data. More specifically, stored data in a memory cell may be determined as 'high' (logic 1) or 'low' (logic 0) depending on whether a terminal voltage of the cell capacitor is high or low.

In principle, while data is stored as an electrical charge in the cell capacitor of a memory cell, there is no power consumption and the stored data may be retained for a long period of time. However, an initial electrical charge stored in the cell capacitor may degrade overtime due to a leakage current occurring, for example, in a PN junction of a MOS transistor. IF there is a substantial degradation of the initial charge, then the stored data may be lost.

Furthermore, as the degree of integration of memory devices increases and the width of line patterns (or critical dimension) of the memory devices decreases, the capacitance of the cell capacitor is also reduced as compared with a bit line capacitance, so that a voltage difference for distinguishing data stored in a memory cell becomes smaller.

While a memory cell, with a capacitor having a reduced capacitance as described above, is coupled to a sense amplifier and is operating, a 1-bit failure may occur. Such 1-bit failure is also referred to hereinafter as an intermittent failure.

For a specific memory cell intermittent failures may occur only sporadically, making their detection and correction problematic. A memory device such as a DRAM typically performs a refresh operation on a constant cycle. For example, an intermittent failure may occur during the time interval of a refresh operation, rendering a typical refresh operation ineffective in correcting it. Furthermore, even though a failed cell detected through a test in a production stage of a memory device may be repaired with a redundancy cell, intermittent failure may also occur in a memory cell not detected as a failed cell during production.

SUMMARY

Various embodiments are directed to a memory device which detects and corrects intermittent failure of memory cells during its own operation.

In an embodiment, a memory device may include a plurality of memory cells; a refresh counter suitable for generating a refresh address; an address storage circuit suitable for storing an additional refresh address; an error detection unit suitable for detecting an error of selected memory cells of the plurality of memory cells in response to a refresh command in a detection period; and a refresh control unit suitable for refreshing memory cells corresponding to the refresh address or the additional refresh address among the memory cells in response to the refresh command, and controlling the refreshing of the memory cells to be delayed in the detection period.

In another embodiment, a memory device may include a plurality of memory cells; an address storage circuit suitable for storing a refresh address; and a control circuit suitable for sequentially refreshing the memory cells, refreshing first memory cells corresponding to the refresh address when a first condition is satisfied, detecting an error of second memory cells selected from the memory cells when a second condition is satisfied, and refreshing the first memory cells after detecting the error of the second memory cells when the first and second conditions are simultaneously satisfied.

In another embodiment, a memory device may include a plurality of memory cells; an address storage circuit suitable for storing a first refresh address; a latch circuit suitable for receiving and latching the first refreshed address from the address storage circuit; an error detection unit suitable for detect ng an error of first memory cells selected from the plurality of memory cells in response to a refresh command in a detection period; an additional refresh counter suitable for performing counting to generate counting information in an additional refresh mode and skipping the counting in the detection period; and a refresh control unit suitable for controlling the first refresh address to be latched in the latch circuit in response to the refresh command when the counting information is a first value in the additional refresh mode, and controlling second word lines corresponding to the latched refresh address to be additionally refreshed in response to the refresh command when the counting information is a second value in the additional refresh mode.

In accordance with exemplary embodiments of the present invention, intermittent failure of memory cell is detected and corrected during an operation of a memory device, so that the memory device may properly operate even though the intermittent failure occurs.

BRIEF DESCRIPTION OF THE DRAWINGS

FIG. 2 is a configuration diagram of a control circuit shown FIG. 1.

DETAILED DESCRIPTION

Figure 1:
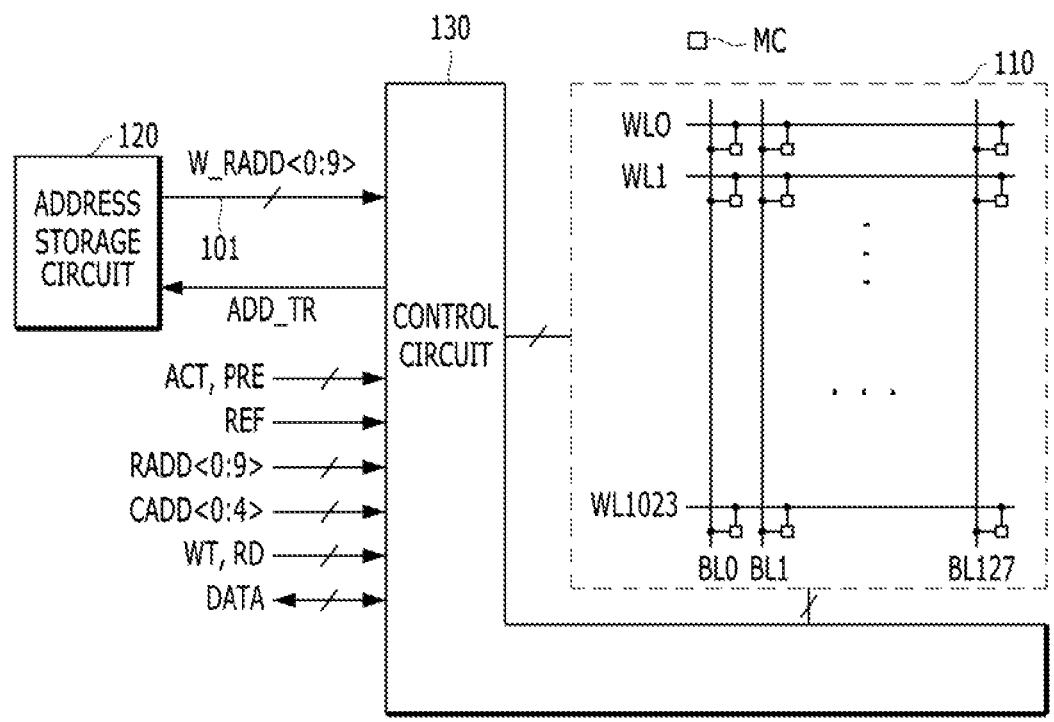
FIG. 1 is a configuration diagram of a memory device, in accordance with an embodiment of the present invention.

Various embodiments will be described below in more detail with reference to the accompanying drawings. The present invention may, however, be embodied in different forms and should not be construed as being limited to the embodiments set forth herein. Rather, these embodiments are provided so that this disclosure will be thorough and complete to those skilled in the art. Throughout the disclosure, like reference numerals refer to like parts throughout the various figures and embodiments of the present invention.

Hereinafter, a detection operation may include detecting and correcting intermittent failure of a memory device. The detection operation may include first and second sub-operations. The first sub-operation may include a first reading of the data of memory cells that are subject to the detection operation and latching the read data. The second sub-operation may include a second reading of the data of the memory cells, comparing the secondly read data with the latched data to detect an intermittent failure, and correcting memory cells for which intermittent failure has been detected.

Hereinafter, a normal refresh operation may refer to sequentially refreshing a plurality of memory cells by using refresh addresses generated in a refresh counter. An additional refresh operation may refer to additional refreshing of memory cells having a short data retention time by using addresses stored in an address generation circuit, in addition to a refresh operation. Furthermore, a word line to which a memory cell having a short data retention time is coupled, may be referred to as a weak word line and an address of a weak word line may be referred to as a weak row address FIG. 1 is a configuration diagram of a memory device in accordance with an embodiment of the present invention.

Referring to FIG. 1, the memory device may include a cell array 110, an address storage circuit 120, and a control circuit 130.

The cell array 110 may include a plurality of rows WL0 to WL1023 (word lines), a plurality of columns BL0 to BL127 (bit lines), and a plurality of memory cells MC coupled between the word lines and the bit lines. The number of rows, columns, and memory cells may vary.

The address storage circuit 12 may store addresses of weak word lines. The address storage circuit 120 may be a nonvolatile memory retaining stored data even when power to the address storage circuit is interrupted. The address storage circuit 120 may be any one of many well-known nonvolatile memories such as an e-fuse array circuit, a NAND flash memory, a NOR flash memory, a MRAM (Magnetoresistive Random Access Memory), a STT-MRAM (Spin Transfer Torque Magnetic Random Access Memory), a ReRAM (Resistive Random Access Memory), a PC RAM (Phase Change Random Access Memory) and/or the like.

The address storage circuit 120 may transmit stored weak addresses W_RADD<0:9> to the control circuit 130 through a transmission line 101 when a transmission signal ADD_TR is received from the control unit 130. In the case of storing a plurality of weak addresses the address storage circuit 120 may sequentially transmit the weak addresses. For example, in the case in which first to $K^{th}$ weak addresses have been stored in the address storage circuit 120, the address storage circuit 120 may transmit the first weak address when the transmission signal ADD_TR is first activated and transmit the second weak address when the transmission signal ADD_TR is activated for a second time. In this way, whenever the transmission signal ADD_TR is activated, the address storage circuit 120 may sequentially transmit weak addresses one by one, thereby transmitting the first to $K^{th}$ weak addresses to the control circuit 130.

The control circuit 130 may sequentially refresh the plurality of word lines WL0 to WL1023 in response to a refresh command periodically inputted, refresh word lines corresponding to the weak addresses of the address storage circuit 120 when a first condition is satisfied, detect errors of selected memory cells when a second condition is satisfied, and perform an error detection operation and then refresh word lines corresponding to the weak addresses when the first and second conditions are simultaneously satisfied. A reference symbol REF indicates a signal activated when a refresh command is inputted.

The first condition may be satisfied when a refresh operation has been performed a predetermined number of times in a state in which an additional refresh mode has been set. An additional refresh operation may be performed in the additional refresh mode. An additional refresh mode may be initiated by a command inputted from an external device. An additional refresh mode may be initiated by a command inputted internally using an internal circuit (not illustrated in FIG. 1). In the case of an internal initiation of an additional refresh mode, the additional refresh mode may be initiated when a specific command (for example, the refresh command) has been inputted a predetermined number of times. The additional refresh mode may be initiated at a predetermined timing using a timer. An additional refresh operation may be performed in response to a refresh command inputted in specific order (for example, a $4*M^{th}$ refresh command and M is a natural number) during the additional refresh mode.

The second condition may be satisfied when the refresh command is inputted during a period in which refresh addresses CNT_ADD<0:9> (see FIG. 2) and row detection addresses DET_RADD<0:9> (see FIG. 2) are substantially equal. The first and second conditions may be simultaneously satisfied when a specific refresh command (for example, a 16th inputted refresh command) is inputted during a period in which the refresh addresses CNT_ADD<0:9> and the row detection addresses DET_RADD<0:9> are substantially equal.

During period in which the refresh addresses CNT_ADD<0:9> and the row detection addresses DET_RADD<0:9> are substantially equal to each other, the control circuit 130 may read and latch data of memory cells corresponding to the row detection addresses DET_RADD<0:9> and column detection addresses DET_CADD<0:4> (see FIG. 2) in a first sub-operation. After the first sub-operation is completed, and a predetermined time elapses, the control circuit 130 may perform a second sub-operation during a period in which the refresh addresses CNT_ADD<0:9> and the row detection addresses DET_RADD<0:9> are substantially equal. The control circuit 130 may read the data of the memory cells for a second time and compare the secondly read data with the latched data. The control circuit 130 may determine the memory cells to be a pass when the secondly read data and the latched data are substantially equal. The control circuit 130 may determine the memory cells to be a fail when the secondly read data and the latched data are different from each other. When a fail is determined for a memory cell, the control circuit 130 may control the latched data to be written in the memory cell.

In a memory device, when the detection operation and the additional refresh operation are all performed in response to a refresh command, they may overlap each other. When the detection operation and the additional refresh overlap each other, the memory device of FIG. 1 may perform the detection operation first and then perform the additional refresh, thereby allowing the two operations to be performed without omission.

FIG. 2 is a configuration diagram of the control circuit 130.

Referring to FIG. 2, the control circuit 130 may include a refresh counter 210, a detection counter 220, an additional refresh control unit 230, an error detection unit 240, a refresh control unit 250, a latch circuit 260, a row circuit 270, and a column circuit 280.

The refresh counter 210 may perform counting whenever a refresh signal REFA is activated and generate the refresh addresses CNT_ADD<0:9> The refresh counter 210 may increase the refresh addresses CNT_ADD 0:9> by 1 through the counting. Increasing the refresh addresses CNT_ADD<0:9> by 1 may represent that when a $K^{th}$ word line has been selected this time, the refresh addresses CNT_ADD<0:9> are changed such that a $K+1^{th}$ word line is selected next time.

However, when a detection operation or an additional refresh operation is performed, the refresh counter 210 may perform no counting. In more detail, when a detection period signal DET_OP has been activated or counting information WR_CNT<0:1> generated in the additional refresh control unit 230 is '11', the refresh counter 210 may perform no counting in response to the refresh signal REFA. Since no counting is performed the values of the refresh addresses CNT_ADD<0:9> are substantially maintained as they are although the refresh signal REFA is activated.

The detection counter 220 may generate the row detection addresses DET_RADD<0:9> and the column detection addresses DET_CADD<0:4> for selecting memory cells for which may perform a detection operation, from the plurality of memory cells MC of the cell array 110. Whenever a detection operation is completed, the detection counter 220 may perform counting and increase the row detection addresses DET_RADD<0:9> or the column detection addresses DET_CADD<0:4>. When the row detection addresses DET_RADD<0:9> or the column detection addresses DET_CADD<0:4> reach an end value, the detection counter 220 may repeat the counting from an initial start value. When the first and second sub-operations have been sequentially completed once with respect to the selected memory cells, the detection operation may be completed.

In a first embodiment, whenever a detection operation is completed, the detection counter 220 may increase the column detection addresses DET_CADD<0:4>. When the detection operation is completed at the end value of the column detection addresses DET_CADD<0:4> (for example, a maximum value), the detection counter 220 may count the value of the column detection addresses DET_CADD<0:4> to an initial value (for example, a minimum value) and increase the row detection addresses DET_RADD<0:9>.

In a second embodiment, whenever a detection operation is completed, the detection counter 220 may increase the row detection addresses DET_RADD<0:9>. When the detection operation is completed at the end value of the row detection addresses DET_RADD<0:9> (for examples a maximum value), the detection counter 220 may count the value of the row detection addresses DET_RADD<0:9> to an initial value (for example, a minimum value) and increase the column detection addresses DET_CADD<0:4>.

The additional refresh control unit 230 may control the weak addresses stored in the address storage circuit 120 to be stored in the latch circuit 260 before an additional refresh operation is performed, and may control word lines corresponding to latch addresses LW_RADD<0:9> stored in the latch circuit 260, instead of word lines corresponding to the refresh addresses CNT_ADD<0:9>, to be refreshed in the additional refresh operation.

When an additional refresh mode has been initiated, that is, in a period in which an additional refresh mode signal WR_MOD has been activated, the additional refresh control unit 230 may count the refresh signal REFA to generate the counting information WR_CNT<0:1>) and control an additional refresh operation by using the counting information WR_CNT<0:1>. An initial value of the counting information WR_CNT<0:1> is '00' and may be counted at a falling edge of the refresh signal REFA. The counting information WR_CNT<0:1> may be repeatedly counted in sequence of '00', '01' '10', and '11'. In 'XY', 'X' may indicate a value of the WR_CNT<1> and 'Y' may indicate a value of the WR_CNT<0>. The additional refresh control unit 430 may activate the transmission signal ADD_TR in a period in which the counting information WR_CNT<0:1> is '01' and may activate an additional refresh signal W_REF in a period in which the counting information WR_CNT<0:1> is '11'.

However, when the detection period signal DET_OP has been activated, the additional refresh control unit 230 may not count the counting information WR_CNT<0:1> even in response to the refresh signal REFA. During a period in which the detection period signal DET_OP has been activated, the additional refresh control unit 230 may deactivate all the transmission signal ADD_TR and the additional refresh signal W_REF. Since no counting is performed the value of the counting information WR_CNT 0.1> is substantially maintained as it is although the refresh signal REFA is activated.

The error detection unit 240 may detect and correct errors of memory cells corresponding to the row detection addresses DET_RADD<0:9> and the column detection addresses DET_CADD<0:4> among the plurality of memory cells MC of the cell array 110. During a period in which the refresh addresses CNT_ADD<0:9> and the row detection addresses DET_RADD<0:9> are substantially equal to each other, the error detection unit 240 may activate the detection period signal DET_OP and toggle a logic value of a flag signal FLAG between a first logic value (for example, low) and a second logic value (for example, high).

During a period in which the detection period signal DET_OP has been activated and the flag signal FLAG has the first logic value, the error detection unit 240 may control data read from memory cells selected by the row detection addresses DET_RADD<0:9> and the column detection addresses DET_CADD<0:4> to be latched in response to the refresh signal REFA. During a period in which the detection period signal DET_OP has been activated and the flag signal FLAG has the second logic value, the error detection unit 240 may compare data read from the selected memory cells with the latched data and detect errors in response to the refresh signal REFA When the read data and the latched data are substantially equal, the error detection unit 240 may determine the states of the selected memory cells to be a pass (no fail). When the read data and the latched data are not substantially equal i.e. when they are different from each other, the error detection unit 240 may determine the states of the selected memory cells to be a fail (failed). When the states of the selected memory cells are determined to be a fail, the error detection unit 240 may control the column circuit 280 so that the latched data may be written in the selected memory cells (a write-back operation). When no error is detected, the error detection unit 240 may deactivate (for example, low) a detection signal DET. When an error is detected, the error detection unit 240 may activate (for example, high) the detection signal DEL The refresh control unit 250 may activate the refresh signal REFA once or many times whenever a refresh command REF is received. The latch circuit 260 may receive and latch the weak addresses W_RADD<0:9> transmitted from the address storage circuit 120 during a period in which the transmission signal ADD_TR has been activated, and output the latch addresses LW_RADD<0:9> during a period in which the additional refresh signal W_REF has been activated.

The row circuit 270 is a circuit for controlling active and precharge operations of word lines selected by row addresses RADD<0:9> the refresh addresses CNT_ADD<0:9> or the latch addresses LW_RADD<0:9>. The row circuit 270 may activate word lines corresponding to the row addresses RADD<0:9> in response to an active signal ACT activated when an active command is inputted, and may precharge the activated word lines in response to a precharge signal PRE activated when a precharge command is inputted. Furthermore, the row circuit 270 may activate/precharge word lines corresponding to the refresh addresses CNT_ADD<0:9> in response to the refresh signal REFA, and may activate/precharge word lines corresponding to the latch addresses LW_RADD<0:9> in response to the refresh signal REFA during a period in which the additional refresh signal W_REF has been activated.

The column circuit 280 may read data DATA from memory cells MC coupled to bit lines selected by column addresses CADD<0:4> in response to a read signal RD activated when a read command is inputted, and may write the data DATA to the memory cells MC in response to a write signal WT activated when a write command is inputted. The data DATA may be inputted/outputted to/from the cell array 110 through the column circuit 280. Since the values of the refresh addresses CNT_ADD<0:9> and the row detection addresses DET_RADD<0:9> are substantially equal during a detection period, the word lines corresponding to the refresh addresses CNT_ADD<0:9> in the detection period correspond to the row detection addresses DET_RADD<0:9>.

When the flag signal FLAG has the first logic value and the detection period signal DET_OP has been activated, the column circuit 280 may transmit data of the memory cells corresponding to the row detection addresses DET_RADD<0:9> and the column detection addresses DET_CADD<0:4> to the error detection unit 240 in response to the refresh signal REFA. When the flag signal FLAG has the second logic value and the detection period signal DET_OP has been activated, the column circuit 280 may transmit the data of the memory cells corresponding to the row detection addresses DET_RADD<0:9> and the column detection addresses DET_CADD<0:4> to the error detection unit 240 in response to the refresh signal REFA, and write data transmitted from the error detection unit 240 in the memory cells corresponding to the row detection addresses DET_RADD<0:9> and the column detection addresses DET_CADD<0:4> in response to the detection signal DET.

A reference numeral 201 indicates a plurality of lines for transferring various signals between the error detection unit 240 and the column circuit 280. In the embodiment of FIG. 1, four bit lines may be selected at a time in response to the column addresses CADD<0:4> or the column detection addresses DET_CADD<0:4>.

Figure 3A:
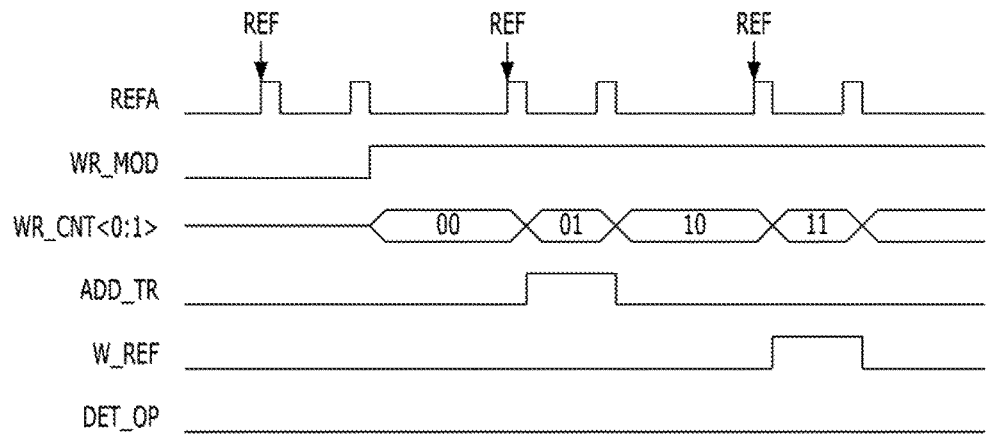
FIG. 3a is a timing diagram illustrating an additional refresh operation when a detection operation and additional refresh do not overlap each other, according to an embodiment of the present invention.
Figure 3B:
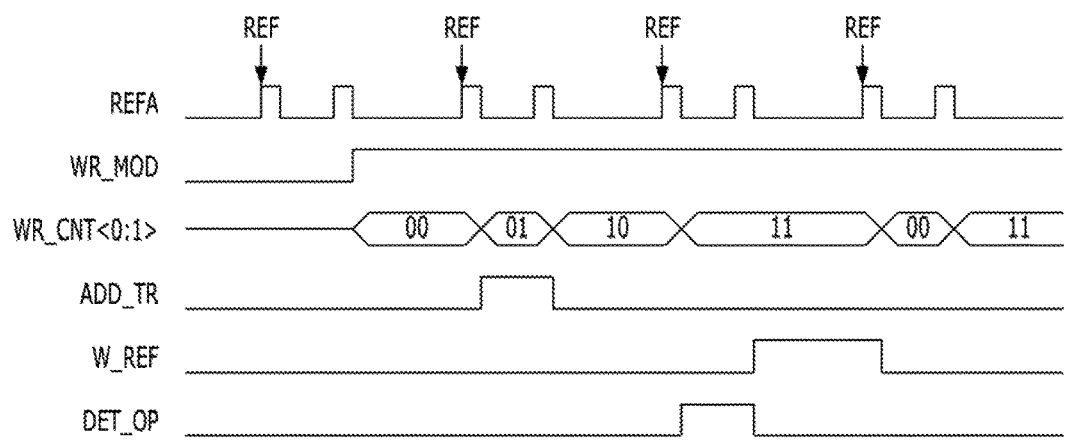
FIG. 3b is a timing diagram illustrating an additional refresh operation when a detection operation and additional refresh overlap each other, according to an embodiment of the present invention.

FIGS. 3a and 3b are diagrams illustrating an operation of an additional refresh control unit 230.

FIG. 3a is a diagram illustrating an additional refresh operation when a detection operation and the additional refresh operation do not overlap each other.

Counting of the counting information WR_CNT<0:1> may be started when the additional refresh mode signal WR_MOD is activated, and '00' is outputted as an initial value of the counting information WR_CNT<0:1>. When the counting information WR_CNT<0:1> is counted from '00' to '01', the transmission signal ADD_TR is activated, and when the counting information WR_CNT<0:1> is counted to '10', the transmission signal ADD_TR is deactivated. That is, the transmission signal ADD_TR may be activated during a period in which the counting information WR_CNT<0:1> is '01'. During a period in which the transmission signal ADD_TR has been activated, the weak addresses W_RADD<0:9> of the address storage circuit 120 may be transmitted to and latched in the latch circuit 260.

When the counting information WR_CNT<0:1> is counted to '11', the additional refresh signal W_REF may be activated, and when the counting information WR_CNT<0:1> is counted to '00', the additional refresh signal W_REF may be deactivated. That is, the additional refresh signal W_REF may be activated in a period in which the counting information WR_CNT<0:1> is '11'. During a period in which the additional refresh signal W_REF has been activated, the additional, refresh operation of word lines corresponding to, the latch addresses LW_RADD<0:9> may be performed.

FIG. 3b is a diagram illustrating an additional refresh operation when the detection operation and the additional refresh operation overlap each other.

Counting of the counting information WR_CNT<0:1> may be started when the additional refresh mode signal WR_MOD is activated, and '00' is outputted as an initial value of the counting information WR_CNT<0:1>. When the counting information WR_CNT<0:1> is counted from '00' to '01', the transmission signal ADD_TR may be activated, and when the counting information WR_CNT<0:1> is counted to '10', the transmission signal ADD_TR may be deactivated.

It is described as an example that the detection period signal DET_OP has been activated during a period in which the counting information WR_CNT<0:1> is '11'. When the counting information WR_CNT<0:1> is counted to '11' the additional refresh signal W_REF is to be activated, but since the detection period signal DET_OP has been activated, the additional refresh signal W_REF is not activated. Furthermore, in the state in which the detection period signal DET_OP has been activated, the value of the counting information WR_CNT<0:1> is not counted and is substantially maintained to '11' although the refresh signal REFA is activated. When the detection period signal DET_OP is deactivated, the additional refresh signal W_REF may be activated, and then the value of the counting information WR_CNT<0:1> may be counted to '00' and the additional refresh signal W_REF may be deactivated in response to the refresh signal REFA. FIG. 3b illustrates the case in which the detection period signal DET_OP has been activated during a period in which the value of the counting information WR_CNT<0:1> is –11', but it is also similar although the detection period signal DET_OP is activated during a period in which the value of the counting information WR_CNT<0:1> is '00', '01', or '10'.

That is, during a period in which the detection period signal DET_OP has been activated, the counting information WR_CNT<0:1> may not be counted and the signals ADD_TR and W_REF for controlling the additional refresh operation may not be activated either. Accordingly, the additional refresh operation may be delayed by the period in which the detection period signal DET_OP has been activated. Accordingly, the detection operation and the additional refresh operation may be sequentially performed without overlapping each other.

Figure 4:
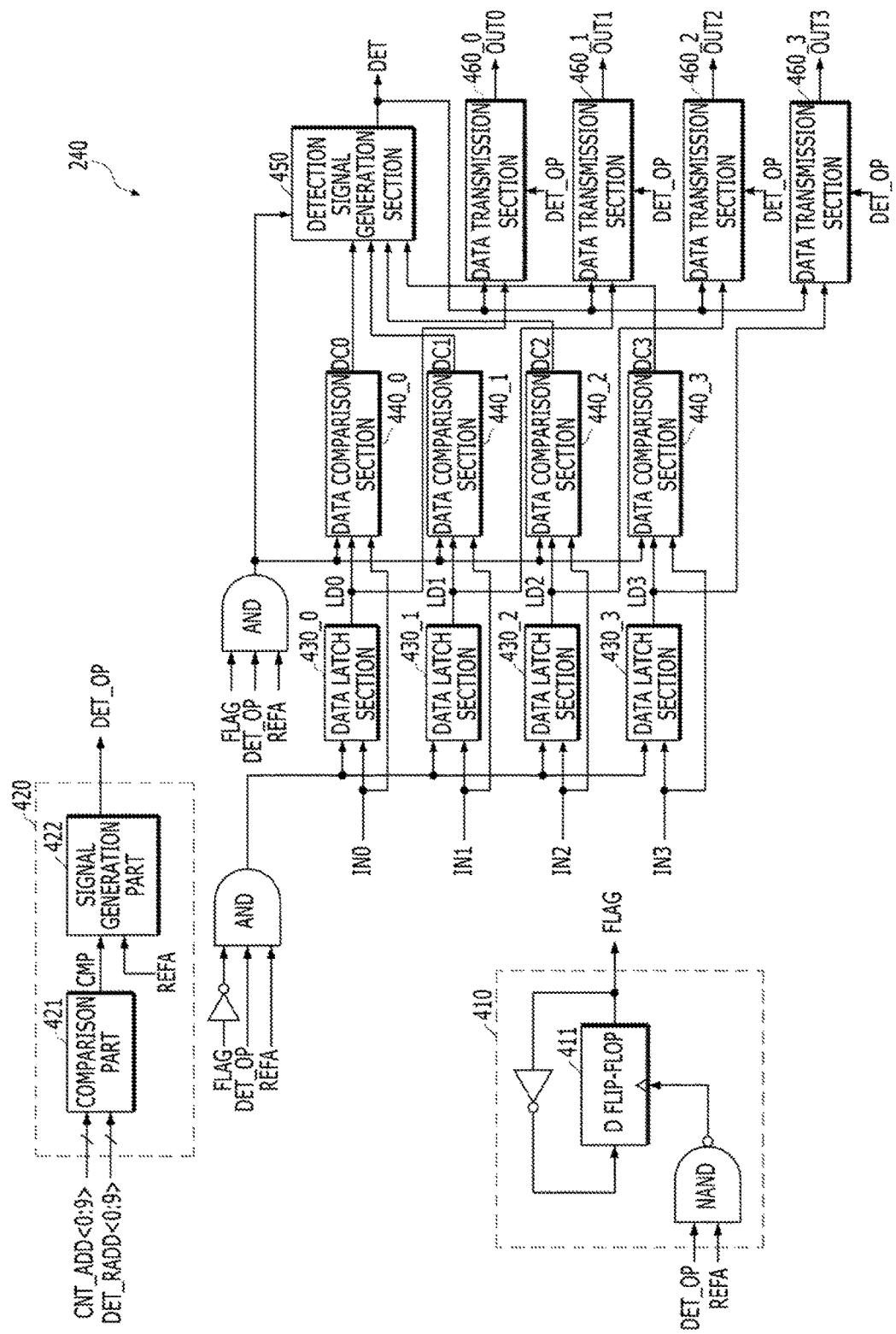
FIG. 4 is a configuration diagram of an error detection unit shown FIG. 2.

Referring to FIG. 4, an error detection unit 240 may include a flag signal generation section 410, a detection period signal generation section 420, a plurality of data latch sections 430_0 to 430_3, a plurality of data comparison sections 440_0 to 440_3, a detection signal generation section 450, and a plurality of data transmission sections 460_0 to 460_3. Reference numerals IN0 to IN3 may denote input lines through which data is transferred to be inputted to the error detection unit 240, and reference numerals OUT0 to OUT3 may denote output lines through which data is transferred to be outputted from the error detection unit 240. The lines 101 of FIG. 1 may include the input lines IN0 to IN3 and the output lines OUT0 to OUT3.

The flag signal generation section 410 may toggle a logic value of the flag signal FLAG in response to the refresh signal REFA in a detection period in which a detection operation is performed. When the detection period signal DET_OP indicating the detection period is activated, the flag signal generation section 410 may toggle the logic value of the flag signal FLAG in response to the refresh signal REFA. In more detail, when the flag signal FLAG has a first logic value (for example, low), the flag signal generation section 410 changes the flag signal FLAG from the first logic value to a second logic value (for example, high) in response to the refresh signal REFA in a period in which the detection period signal DET_OP has been activated. Furthermore, when the flag signal FLAG has the second logic value, the flag signal generation section 410 changes the flag signal FLAG from the second logic value to the first logic value in response to the refresh signal REFA during a period in which the detection period signal DET_OP has been activated. The detection period may be a period in which the row detection addresses DET_RADD<0:9> and the refresh addresses CNT_ADD<0:9> are substantially equal to each other. The flag signal generation section 410 may include a D flip-flop 411 and a NAND gate.

The detection period signal generation section 420 may include a comparison part 421 and a signal generation part 422. The comparison part 421 may compare the refresh addresses CNT_ADD<0:9> with the row detection addresses DET_RADD<0:9> deactivate (for example, low) a comparison signal CMP when they are not substantially equal, and activate (for example, high) the comparison signal CMP when they are substantially equal to each other. The signal generation part 422 may activate the detection period signal DET_OP when the comparison signal CMP is activated, and may deactivate the detection period signal DET_OP in response to the refresh signal REFA in the state in which the comparison signal CMP has been activated.

The plurality of data latch sections 430_0 to 430_3 respectively correspond to the input liens IN0 to IN3, and may latch data, which has been transferred to the respective input lies IN0 to IN3, in response to the refresh signal REFA when the flag signal FLAG has the first logic value and the detection period signal DET_OP has been activated. Data of the input liens IN0 to IN3 may be data firstly read from selected memory cells MC. The plurality of data latch sections 430_0 to 430_3 may output the latched data LD0 to LD3.

The plurality of data comparison sections 440_0 to 440_3 may output results DC0 to DC3, which have been obtained by comparing the latched data LD0 to LD3 outputted from the respective data latch sections 430_0 to 430_3 with data transferred to the respective input liens IN0 to IN3, in response to the refresh signal REFA when the flag signal FLAG has the second logic value and the detection period signal DET_OP has been activated. The data comparison sections 440_0 to 440_3 may deactivate the result DC0_to DC3 (for example, low) when the latched data LD0 to LD3 are substantially equal to data of the input lines IN0 to IN3 and may activate the results DC0 to DC3 (for example, high) when the latched data LD0 to LD3 are different from the data of the input lines IN0 to IN3.

The detection signal generation section 450 may deactivate the detection signal DET in response to the refresh signal REFA when all the results DC0 to DC3 are deactivated, that is, when the firstly read data (the latched data LD0 to LD3) is substantially equal to the secondly read data (the data of the input lines IN0 to IN3) in the case in which the flag signal FLAG has the second logic value and the detection period signal DET_OP has been activated. Furthermore, in the case in which the flag signal FLAG has the second logic value and the detection period signal DET_OP has been activated, the detection signal generation section 450 may activate the detection signal DET in response to the refresh signal REFA, when one or more signals of the results DC0 to the DC3 are activated, that is, when the firstly read data is different from the secondly read data.

The plurality of data transmission sections 460_0 to 460_3 may respectively transfer the latched data LD0 to LD3, which have been outputted from the data latch sections 430_0 to 430_3, respectively, to the output lines OUT0 to OUT3 when the detection signal DET is activated in the case in which the flag signal FLAG has the second logic value and the detection period signal DET_OP has been activated. The data transferred to the output lines OUT0 to OUT3 may be written in the selected memory cells MC via the column circuit 280. At this time, a write-back operation may be performed after a pass/fail determination of the selected memory cells is completed.

Figure 5:
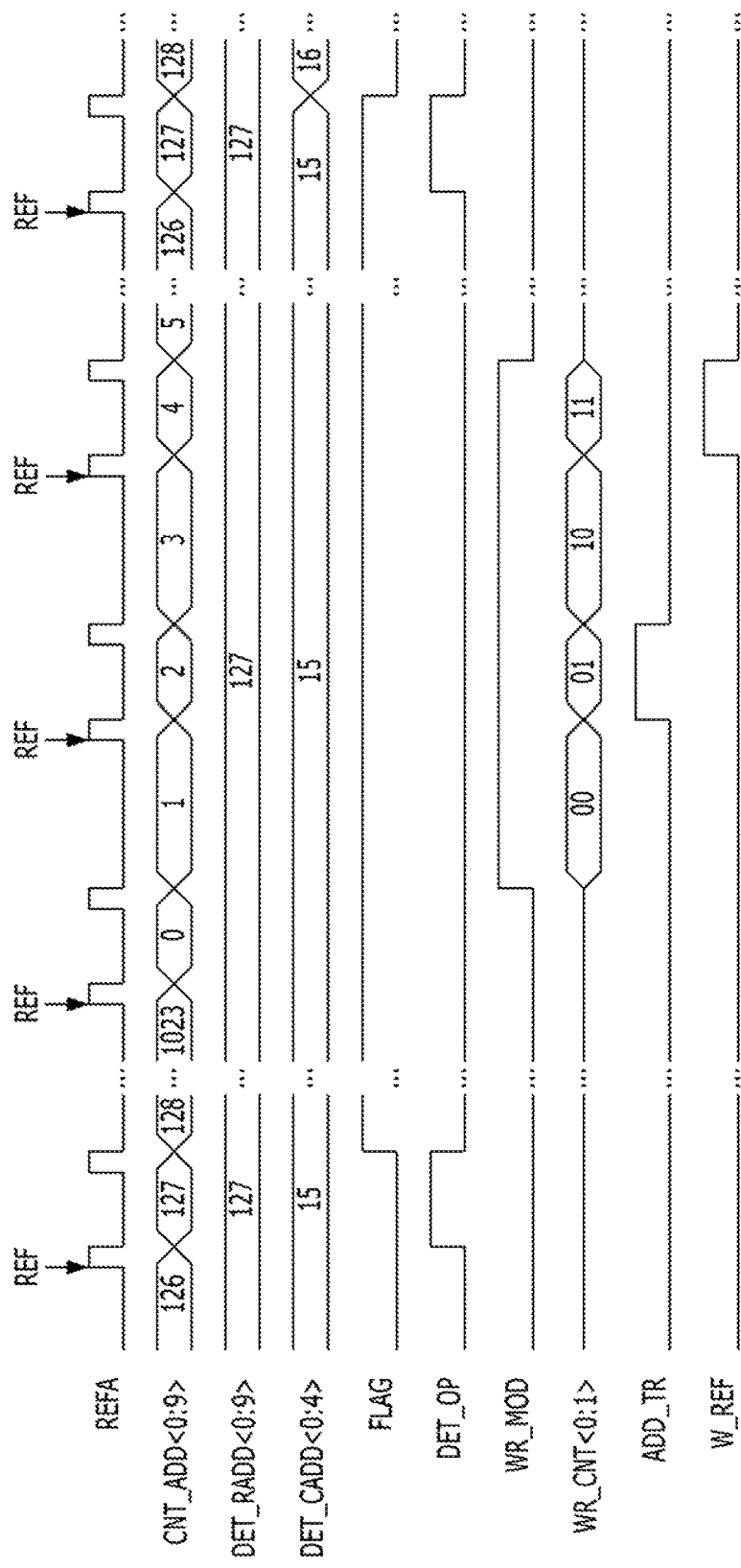
FIG. 5 is a timing diagram illustrating an operation of the memory device of FIG. 1.

FIG. 5 is a diagram illustrating an operation of the memory device of FIG. 1. FIG. 5 describes the operation of the memory device when the detection operation and the additional refresh operation do not overlap each other. Hereinafter, the refresh addresses CNT_ADD<0:9>, the row detection addresses DET_RADD<0:9>, the column detection addresses DET_CADD<0:4>, and the counting information WR_CNT<0:1> are expressed by decimal numbers. Furthermore, the refresh signal REFA is described to be activated twice when the refresh command REF is inputted.

When the refresh addresses CNT_ADD<0:9> is 126 and row detection addresses DET_RADD<0:9> is 127, the two addresses are different from each other, and the detection period signal DET_OP substantially maintains a deactivated state. When the refresh addresses CNT_ADD<0:9> are counted to 127, and substantially equal to the row detection addresses DET_RADD<0:9>, the detection period signal DET_OP is activated. Since the flag signal FLAG is low, data of memory cells corresponding to the row detection addresses DET_RADD<0:9>=127 and the column detection addresses DET_CADD<0:4>=15 is read and is latched in the error detection unit 240 in response to the refresh signal REFA (a first sub-operation). When the first sub-operation is performed, the logic value of the flag signal FLAG is changed to high. At this time, the refresh addresses CNT_ADD<0:9> are not counted.

It is described as an example that the additional refresh mode signal WR_MOD is activated between the first and second sub operations, that is, before the refresh addresses CNT_ADD<0:9> are counted to 127 again. When the additional refresh mode signal WR_MOD is activated, the counting information WR_CNT<0:1> is counted in response to the refresh signal REFA. In a period in which the counting information WR_CNT<0:1> is 1, the transmission signal ADD_TR is activated and the weak addresses W_RADD<0:9> are transmitted from the address storage circuit 120 to the latch circuit 260. In a period in which the counting information WR_CNT 0:1> is 3, the additional refresh signal W_REF is activated and word lines corresponding to the weak addresses W_RADD<0:9> are additionally refreshed. When the additional refresh mode signal WR_MOD is deactivated, no additional refresh operation is performed.

When the refresh addresses CNT_ADD<0:9> are counted to 127 again the detection period signal DET_OP is activated. Since the flag signal FLAG is high, the data of the memory cells corresponding to the row detection addresses DET_RADD<0:9>=127 and the column detection addresses DET_CADD<0:4>=15 is read in response to the refresh signal REFA and is compared with the data latched in the error detection unit 240. As a result of the comparison, when fail determination is made, the data latched in the error detection unit 240 is written in the memory cells corresponding to the row detection addresses DET_RADD<0:9 and the column detection addresses DET_CADD<0:4>=15 (a second sub-operation). At this time, the refresh addresses CNT_ADD 0:9> are not counted.

In FIG. 5, the operation of the memory device using the detection counter 220 in accordance with a first embodiment has been described. Accordingly, when the second sub-operation is completed, the column detection addresses DET_CADD<0:4> are counted from 15 to 16.

Figure 6:
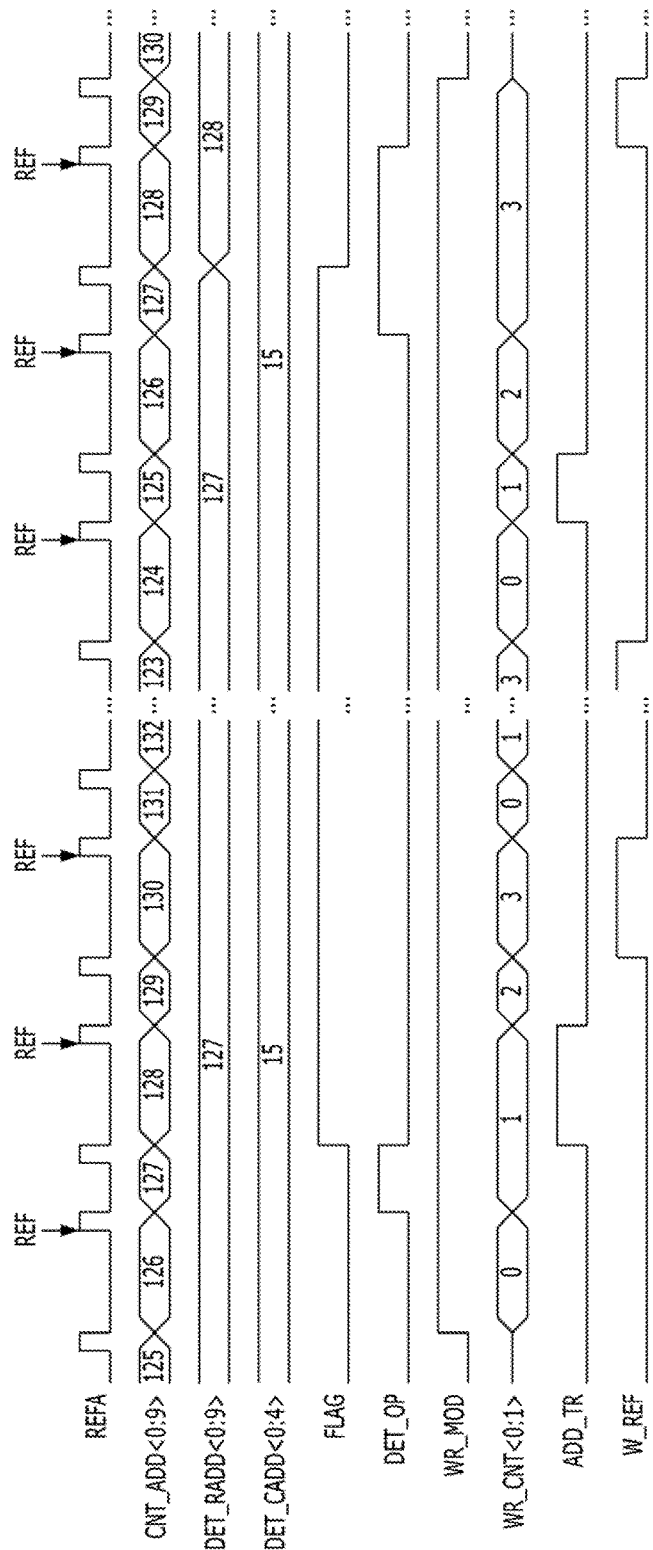
FIG. 6 is a diagram illustrating an operation of the memory device of FIG. 1.

FIG. 6 is a diagram illustrating an operation of the memory device of FIG. 1. FIG. 6 describes the operation of the memory device when the detection operation and the additional refresh operation overlap each other. Hereinafter, the refresh addresses CNT_ADD<0:9>, the row detection addresses DET_RADD<0:9>, the column detection addresses DET_CADD<0:4>, and the counting information WR_CNT<0:1> are expressed by decimal numbers. Furthermore, the refresh signal REFA is described to be activated twice when the refresh command REF is inputted.

It is described as an example that the additional refresh mode signal WR_MOD has been activated when the refresh addresses CNT_ADD<0:9> is 126. The counting information WR_CNT<0:1> is outputted to 0. When the refresh addresses CNT_ADD<0:9> is 126 and the row detection addresses DET_RADD<0:9> is 127, the two addresses are different from each other, and the detection period signal DET_OP substantially maintains a deactivated state. When the refresh addresses CNT_ADD<0:9> are counted to 127 in response to the refresh signal REFA, and substantially equal to the row detection addresses DET_RADD<0:9> the detection period signal DET_OP is activated. The counting information WR_CNT<0:1> is counted to 1, but since he detection period signal DET_OP is in the activated state, the transmission signal ADD_TR is not activated.

Then, when the refresh signal REFA is activated, data of memory cells corresponding to row detection addresses DET_RADD<0:9>=127 and the column detection addresses DET_CADD<0:4>=15 is read and is latched in the error detection unit 240 (a first sub-operation). When the first sub-operation is performed, the logic value of the flag signal FLAG is changed to high. At this time, the refresh addresses CNT_ADD<0:9> and the counting information WR_CNT 0:1> are not counted.

When the detection period signal DET_OP is deactivated the transmission signal ADD_TR is activated and the weak addresses W_RADD<0:9> are transmitted from the address storage circuit 120 to the latch circuit 260. When the counting information WR_CNT<0:1> is counted to 3, the additional refresh signal W_REF is activated and the additional refresh operation is performed.

Hereinafter, a process in which the refresh addresses CNT_ADD<0:9> are counted and a second sub-operation is performed will be described. It is described as an example that the counting information, WR_CNT<0:1> is 1 and the additional refresh mode signal WR_MOD is in an activated state when the refresh addresses CNT_ADD<0:9> is 124. When the refresh addresses CNT_ADD<0:9> are counted to 127, the counting information WR_CNT<0:1> is counted to 3. Since the detection period signal DET_OP is activated, the additional refresh signal W_REF is not activated. The sub-operation is performed for memory cells corresponding to the row detection addresses DET_RADD<0:9>=127 and the column detection addresses DET_CADD<0:4>=15 in response to the refresh signal REFA, and at this time, the refresh addresses CNT_ADD<0:9> and the counting information WR_CNT<0:1> are not counted.

In FIG. 6, the operation of the memory device using the detection counter 220 in accordance with a second embodiment has been described. Accordingly, when the second sub-operation is completed, the row detection addresses DET_RADD<0:9> are counted from 127 to 128. When the refresh addresses CNT_ADD<0:9> are counted to 128, the refresh addresses CNT_ADD<0:9> and the row detection addresses DET_RADD<0:9> are substantially equal to each other, and the first-sub operation of memory cells corresponding to the row detection addresses DET_RADD<0:9>=128 and the column detection addresses DET_CADD<0:4>=15 is performed (the detection period signal DET_OP is activated). Accordingly, the counting information WR_CNT<0:1> is not continuously counted twice, and the additional refresh operation is performed in response to the refresh signal REFA in a period in which the refresh addresses CNT_ADD<0:9> is 129.

Although various embodiments have been described for illustrative purposes, it will be apparent to those skilled in the art that various changes and modifications may be made without departing from the spirit and scope of the invention as defined in the following claims.

What is claimed is:
1. A memory device comprising:
a plurality of memory cells;
a refresh counter suitable for generating a refresh address;
an address storage circuit suitable for storing an additional refresh address;
an error detection unit suitable for detecting an error of selected memory cells of the plurality of memory cells in response to a refresh command in a detection period; and
a refresh control unit suitable for refreshing memory cells corresponding to the refresh address or the additional refresh address among the memory cells in response to the refresh command, and controlling the refreshing of the memory cells to be delayed after the detection period in a case where the detecting of the error of the selected memory cells and the refreshing of the memory cells are to overlap each other.

2. The memory device of claim 1, wherein the error detection unit compares firstly read data and secondly read data of the selected memory cells with each other, thereby detecting the error of the selected memory cells.

3. The memory device of claim 2, wherein the error detection unit latches the firstly read data of the selected memory cells, and compares the secondly read data of the selected memory with the latched data after a predetermined time lapses, thereby detecting the error of the selected memory cells.

4. The memory device of claim 2, wherein when the selected memory cells is determined to be failed by detecting the error thereof, the error detection unit controls the firstly read data to be written in the selected memory cells.

5. The memory device of claim 1, wherein the refresh control unit controls the memory cells corresponding to the additional refresh address to be refreshed with high frequency as compared with the other memory cells.

6. The memory device of claim 1, wherein when the memory cells corresponding to the additional refresh address are refreshed, the refresh control unit controls the refreshing of the memory cells corresponding to the refresh address to be delayed.

7. The memory device of claim 1, wherein the refresh counter performs counting in response to the refresh command, and skips the counting when the refresh control unit refreshes the memory cells corresponding to the additional refresh address or the error detection unit detests the error of the selected memory cells.

8. The memory device of claim 1, wherein the address storage circuit includes a nonvolatile memory.

9. A memory device comprising:
a plurality of memory cells;
an address storage circuit suitable for storing a refresh address; and
a control circuit suitable for sequentially refreshing the memory cells, refreshing first memory cells corresponding to the refresh address when a first condition is satisfied, detecting an error of second memory cells selected from the memory cells when a second condition is satisfied, and refreshing the first memory cells after detecting the error of the second memory cells in a case where the first and second conditions are simultaneously satisfied.

10. The memory device of claim 9, wherein the control circuit latches firstly read data of the second memory cells, and compares secondly read data of the second memory cells and the latched data after a predetermined time lapses, thereby detecting the error of the second memory cells.

11. The memory device of claim 9, wherein when the second memory cells is determined to be failed by detecting the error thereof, the control circuit controls the firstly read data to be written in the second memory cells.

12. The memory device of claim 10, wherein the first condition is satisfied when the memory cells are sequentially refreshed by a predetermined number of times in a state in which an addition refresh mode is set.

13. The memory device of claim 10, wherein the second condition is satisfied when a refresh command is inputted in a state in which the refresh address and a row detection address are substantially equal to each other.

14. A memory device comprising:
a plurality of memory cells;
an address storage circuit suitable for storing a first refresh address;
a latch circuit suitable for receiving and latching the first refresh address from the address storage circuit;
an error detection unit suitable for detecting an error of first memory cells selected from the plurality of memory cells in response to a refresh command in a detection period;
an additional refresh counter suitable for performing counting to generate counting information in an additional refresh mode and skipping the counting in the detection period; and
a refresh control unit suitable for controlling the first refresh address to be latched in the latch circuit in response to the refresh command when the counting information is a first value in the additional refresh mode, and controlling second word lines corresponding to the latched refresh address to be additionally refreshed in response to the refresh command when the counting information is a second value in the additional refresh mode.

15. The memory device of claim 14, wherein the error detection unit latches firstly read data of the first memory cells, and compares secondly read data of the first memory cells with the latched data after a predetermined time lapses, thereby detecting the error of the first memory cells.

16. The memory device of claim 14, further comprising:
a refresh counter suitable for performing counting to generate a second refresh address, and skipping the counting when the second word lines are additionally refreshed or the error of the first memory cells are detected.

17. The memory device of claim 16, wherein the refresh control unit controls third memory cells corresponding to the second refresh address among the memory cells to be refreshed in response to the refresh command, and controls the refreshing of the third memory cells to be delayed when the second word lines are additionally refreshed or the error of the first memory cells are detected.

18. The memory device of claim 14, wherein when the error detection unit generates row and column detection addresses, the first memory cells include memory cells corresponding to the row and column detection addresses among the memory cells, and the detection period is a period in which the row detection address and the refresh address are substantially equal to each other.

19. The memory device of claim 14, wherein the address storage circuit includes a nonvolatile memory.

20. The memory device of claim 15, wherein, when the first memory cells is determined to be failed by detecting the error thereof, the error detection unit controls the firstly read data to be written in the selected memory cells.

* * * * *